(12) United States Patent
Aufschneider et al.

(10) Patent No.: US 11,355,297 B2
(45) Date of Patent: Jun. 7, 2022

(54) SAFETY-RELATED SWITCHING DEVICE

(71) Applicant: Siemens Aktiengesellschaft, Munich (DE)

(72) Inventors: Klaus Aufschneider, Illschwang (DE); Michael Lehner, Kohlberg (DE); Manfred Prölss, Ebermannsdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 336 days.

(21) Appl. No.: 16/328,263

(22) PCT Filed: Aug. 14, 2017

(86) PCT No.: PCT/EP2017/070557
§ 371 (c)(1),
(2) Date: Feb. 25, 2019

(87) PCT Pub. No.: WO2018/036850
PCT Pub. Date: Mar. 1, 2018

(65) Prior Publication Data
US 2021/0287863 A1    Sep. 16, 2021

(30) Foreign Application Priority Data
Aug. 26, 2016 (EP) .................... 16185891

(51) Int. Cl.
*H01H 47/22* (2006.01)
*H01H 47/00* (2006.01)
*H01H 50/44* (2006.01)

(52) U.S. Cl.
CPC .......... *H01H 47/22* (2013.01); *H01H 47/002* (2013.01); *H01H 50/44* (2013.01); *H01H 47/001* (2013.01)

(58) Field of Classification Search
CPC .... H01H 47/001; H01H 47/002; H01H 47/22; H01H 7/26; H01H 50/44; H02H 7/26
See application file for complete search history.

(56) References Cited

U.S. PATENT DOCUMENTS 4,516,185 A * 5/1985 Culligan ................ H01H 47/04
361/154
4,674,002 A * 6/1987 Li .......................... H02H 7/262
361/66

(Continued)

FOREIGN PATENT DOCUMENTS

CN       104062914 A    9/2014
CN       104285352 A    1/2015
(Continued)

OTHER PUBLICATIONS

European Search Report dated Nov. 24, 2016 corresponding to European Application No. 16185891.5; 9 pp.

(Continued)

*Primary Examiner* — Harry R Behm
(74) *Attorney, Agent, or Firm* — Lempia Summerfield Katz LLC

(57) ABSTRACT

The invention relates to a safety-related switching device (10) which is equipped with an electromagnetic coil (12), a control unit (20) and a first switching means (22). The first switching means (22) is designed to activate and deactivate the electromagnetic coil (12). Moreover, the first switching means (22) is designed to receive a coil control signal (24), a monitoring signal (32) and a first higher-level control signal (26). The safety-related switching device (10) also has a receiver unit (40) for receiving an external control signal (29). The receiver unit (40) is designed to generate the first higher-level control signal (26) and a second higher-level control signal (28) from the external control signal (29). The (Continued)

control unit (20) is designed to receive the second higher-level control signal (28).

13 Claims, 3 Drawing Sheets

(56) References Cited

U.S. PATENT DOCUMENTS

| | | | |
|---|---|---|---|
| 5,910,718 A * | 6/1999 | Kawarazaki | G05B 9/03 |
| | | | 318/447 |
| 8,014,725 B2 | 9/2011 | Danzer | |
| 9,407,086 B2 | 8/2016 | Veil | |
| 2003/0181998 A1 | 9/2003 | Schenk | |
| 2007/0076333 A1 | 4/2007 | Battani | |
| 2007/0223172 A1 | 9/2007 | Gauxmann | |
| 2008/0034248 A1 | 2/2008 | Danzer | |
| 2011/0116196 A1 * | 5/2011 | Kellis | H02H 7/0816 |
| | | | 361/30 |
| 2011/0169345 A1 | 7/2011 | Matsumoto | |
| 2013/0070490 A1 * | 3/2013 | Liu | H02M 1/12 |
| | | | 363/40 |
| 2014/0232205 A1 | 8/2014 | Li | |
| 2018/0218862 A1 * | 8/2018 | Matsuo | H01F 7/1844 |

FOREIGN PATENT DOCUMENTS

| | | |
|---|---|---|
| DE | 10011410 | 9/2001 |
| DE | 102004040059 | 2/2006 |
| DE | 102015101778 A1 | 8/2006 |
| DE | 102012101516 | 8/2013 |
| EP | 1636808 B1 | 9/2006 |
| EP | 1770738 | 4/2007 |

OTHER PUBLICATIONS

PCT International Search Report and Written Opinion of International Searching Authority dated Sep. 21, 2017 corresponding to PCT International Application No. PCT/EP2017/070557 filed Aug. 14, 2017; 15 pp.

Chinese Office Action for Chinese Application No. 201780052035.1 dated Sep. 25, 2019, with English translation.

Indian Office Action for Indian Patent Application No. 201937003826 dated Feb. 24, 2020.

* cited by examiner

SAFETY-RELATED SWITCHING DEVICE

This application is the National Stage of International Application No. PCT/EP2017/070557, filed Aug. 14, 2017, which claims the benefit of European Patent Application No. 16185891.5, filed Aug. 26, 2016. The entire contents of these documents are hereby incorporated herein by reference.

The present embodiments relate to a safety-related switching device and an associated operating method. The present embodiments also relate to a computer program product by which the operating method is implemented in a safety-related switching device. The present embodiments further relate to a switching system in which the claimed safety-related switching device is used.

US 2011/0169345 A1 (Omron Corporation, JP) Jul. 14, 2011 discloses a control system for an electric motor. The control system is connected to a programmable logic controller (PLC) and a door switch. The control system also has two contactors that are triggered separately by the door switch and the PLC. The PLC further monitors the switching operation of one of the two contactors. The switching operation is initiated by the door switch. The control system according to US 2011/0169345 A1 is intended to satisfy the requirements of Safety Category 2 according to ISO 13849-1.

The solutions known from the prior art have the disadvantage that the solutions include a large number of individual components with considerable wiring expense. Moreover, there exists in the field of automation engineering a requirement for a switching device and a switching system that offer a high degree of safety, are simultaneously easy and economical to manufacture, and allow ease of installation.

SUMMARY AND DESCRIPTION

The scope of the present invention is defined solely by the appended claims and is not affected to any degree by the statments within this summary.

The present embodiments may obviate one or more of the drawbacks or limitations in the related art. For example, a safety-related switching device that overcomes the aforementioned disadvantages of the prior art and, in a simple manner, offers a high degree of safety within the meaning of the relevant standards is provided.

A safety-related switching device includes a magnetic coil by which a load circuit (e.g., a power supply of an electric motor) may be opened and closed. The safety-related switching device also has a control unit that is suitable for receiving, evaluating, and sending signals. The safety-related switching device further includes a first switching device that is configured to activate and deactivate the magnetic coil directly. The activation and deactivation of the magnetic coil in this case takes place as a function of signals that are received by the first switching device. According to the present embodiments, the first switching device is configured to receive a coil control signal that is generated by the control unit or via initiation by the control unit. The first switching device is likewise configured to receive a monitoring signal, by which it is possible to detect a deviation of the control unit from a normal operating state. The first switching device receives a first higher-level control signal. The safety-related switching device also has a receiver unit that is configured to receive an external control signal that is sent from a control entity at a higher level than the safety-related switching device. The receiver unit is configured to generate the first higher-level control signal and the second higher-level control signal from the external control signal and to supply the signals to the first switching device or the control unit, respectively; the receiver unit is therefore configured to generate the first higher-level control signal, which is forwarded to the first switching device, and a second higher-level control signal, which is sent to the control unit, from the external control signal. A corresponding preparation of the external signal is performed by the receiver unit, such that the first higher-level control signal and/or second higher-level control signal is forwarded in a suitable format to the control unit or the first switching device, respectively. The first higher-level control signal and the second higher-level control signal may be configured to be identical or complementary to each other in this case, such that the second higher-level control signal may be derived unambiguously from the first higher-level control signal. Conversely, the first higher-level control signal may also be unambiguously derivable from the second higher-level control signal. This provides that the external control signal is captured and processed by the receiver unit using multiple channels. Moreover, the control unit is configured to receive the second higher-level control signal.

The first switching device is configured to logically associate the coil control signal, the monitoring signal, and the first higher-level control signal and. Based on the logical association, the first switching device is configured to determine whether the magnetic coil is to be activated. If at least one of the signals received by the first switching device requires a deactivation of the magnetic coil, a deactivation signal is sent to the magnetic coil.

By the association of the coil control signal, the monitoring signal, and the first higher-level control signal, an erroneous activation signal is prevented from being sent to the magnetic coil in numerous operating scenarios. A high degree of safety for the operation of the magnetic coil is thereby achieved. The first higher-level control signal is therefore confirmed in the first switching device by the coil control signal from the control unit. This is confirmed by the presence of the monitoring signal that, in the normal operation of the safety-related switching device, shows a normal operating state of the control unit. The safety-related switching device therefore refers to signals that are generated for other functions in a safety-related switching device. Therefore, a reliable and correct activation or deactivation of the magnetic coil is achieved by the first switching device even in the event of a failure of components in the safety-related switching device. Additional wiring, via which external signals are sent to the safety-related switching device, is unnecessary in the solution of the present embodiments. This allows simpler installation of the safety-related switching device in an automation system.

The receiver unit allows a single-channel signal from the higher-level control entity to be supplied to the safety-related switching device in a suitable manner. Use of the second higher-level control signal thus provides the dual-channel postprocessing of a single-channel external control signal. If two channels are used, a fault tolerance of one channel is achieved for the purpose of triggering by an external higher-level control entity. If the multiplicity of channels is increased, a higher fault tolerance is realized accordingly.

The receiver unit and the first switching device are directly connected together (e.g., via a signal line) for the purpose of transferring the first higher-level control signal from the receiver unit to the first switching device. This provides that the first higher-level control signal may be transferred directly (e.g., without passing through further postprocessing units and processes) from the receiver unit to the first switching device.

The control unit is configured to initiate sending of the coil control signal based on the received second higher-level control signal. The control unit may be configured to generate the coil control signal. In addition to the second higher-level control signal, a configuration data record and/or a parameter record that is stored in the control unit may also be taken into account when generating the coil control signal. For example, the configuration data record and/or the parameter record includes information about the class of size of the safety-related switching device and/or encoding information for the coil control signal. The second higher-level control signal is used to provide the consistency of the signals received by the first switching device.

In one embodiment of the safety-related switching device, this is equipped with a second switching device. The second switching device forms a controlled freewheeling circuit and is connected to the control unit and the magnetic coil. The power supply of the magnetic coil is controlled via the freewheeling circuit by the control unit. By this, the principle of a controlled freewheeling circuit is realized. The second switching device is coupled to the control unit and is suitable for interrupting the power supply of the magnetic coil via a deactivation instruction. The functioning of the first switching device may be monitored in turn by the second switching device in the freewheeling circuit. Likewise, the functioning of the second switching device may be monitored by the first switching device. If, for example, due to a fault in the first switching device, contrary to the coil control signal, the monitoring signal, and/or the first higher-level control signal, the first switching device continues to instruct an activation of the magnetic coil, this is counteracted by the second switching device. For example, this prevents a fault of an individual component (e.g., the first switching device) from resulting in a failure of the safety-related switching device overall. The second switching device is therefore part of a controlled freewheeling circuit and serves as a redundant cutoff element.

In a further embodiment, the receiver unit may also be configured such that the first higher-level control signal and the second higher-level control signal are already contained separately in the external control signal, and therefore, a dual-channel external control signal is present. This creates a connection to the higher-level control entity that is both simple and effective with respect to safety, and counteracts the occurrence of fault conditions during the operation of the magnetic coil. The safety that may be achieved by the claimed switching device is also increased thereby.

The first switching device is configured to deactivate the magnetic coil if at least one of the incoming signals (e.g., the first higher-level control signal, the coil control signal, or the monitoring signal) prescribes a coil deactivation. The safety-related switching device of one or more of the present embodiments is based on correctly identifying a fault condition that occurs in at least one of the components of the safety-related switching device or in the higher-level control entity and initiating a corresponding countermeasure. The use of the first higher-level control signal as a criterion for deactivating the magnetic coil uses the safety-related capabilities of the higher-level control entity. The control unit is able to evaluate a multiplicity of safety-relevant information and to influence the magnetic coil via the coil control signal in a safety-related manner. The monitoring signal as a deactivation criterion for the magnetic coil allows the resilience of the watchdog to be used not only for the safe operation of the control unit, but also for the direct activation or deactivation of the magnetic coil. A deactivation of the magnetic coil may be initiated by a corresponding logical association of the first higher-level control signal, the coil control signal and the monitoring signal using simple and reliable components. The present embodiments overall offer a significant increase in safety at the same time as reduced material expense.

Alternatively, the safety-related switching device of the one or more of the present embodiments may also have an auxiliary control unit that monitors the functional capability of the control unit. The auxiliary control unit may have the same structural format as the control unit.

A second switching device, which is also used to deactivate the magnetic coil, may also be assigned to the safety-related switching device. The second switching device may be actuated independently of the first switching device and coupled to the control unit via a separate freewheeling circuit. In normal operation, the current strength is captured by a measuring device and the measured data is forwarded to the control unit. A reference value for the current strength that is to be present in the magnetic coil is stored in the control unit. The reference value is independent of the structural size of the safety-related switching device in this case and may be set by, for example, parameterization in the control unit. A selectable tolerance value is also stored in the control unit, and may be taken into account when comparing the reference value with the measured data from the measuring device. If the magnitude of the current strength that is present in the magnetic coil differs from the reference value by more than the selectable tolerance value, a critical state of the magnetic coil is identified, (e.g. an overcurrent or an undercurrent). If a critical state of the magnetic coil is identified, an instruction from the control unit actuates the second switching device such that the magnetic coil is deactivated by interrupting the power supply thereof. By virtue of the freewheeling circuit including the second switching device, the control unit has an additional device for deactivating the magnetic coil.

By virtue of the freewheeling circuit, the control unit is able to actuate the second switching device in addition to the first switching device in order to deactivate the magnetic coil. A redundancy for deactivating the magnetic coil is provided thereby. As a consequence, the actuation safety of the safety-related switching device is further increased.

In one embodiment, the first switching device or the second switching device in each case includes a semiconductor switch (e.g., a transistor such as an insulated gate bipolar transistor (IGBT)) or a metal oxide semiconductor field effect transistor (MOSFET), and/or at least one logic module. These are simple, reliable and cost-efficient electronic components that allow particularly economical manufacture of the safety-related switching device.

A pulse-width modulation (PWM) signal adopts a high state and a low state alternately. The transition between the high state and the low state takes place at a frequency that is interpreted by the first switching device as an activation signal to the magnetic coil. This is achieved by using the response delay of a logic module, for example. The coil control signal may therefore be configured as a functional element of an existing PWM signal, such that a separate path for the coil control signal is unnecessary. Additionally or alternatively, the monitoring signal may be configured as an output signal of a watchdog that is connected to the control unit. The use of the monitoring signal for the first switching device therefore requires only minimal material expense. This likewise increases the simplicity and hence resilience and economic viability of the inventive safety-related switching device. Moreover, a longer repeat test interval of up to one month may be achieved.

In a further embodiment, the magnetic coil is used to open and close a load circuit that carries a power of 50 kW to 750 kW. The safety-related switching device of one or more of the present embodiment is therefore also suitable for correspondingly large magnetic coils requiring a higher level of driving power. The safety-related switching device is readily adaptable to a wide range of intended uses and offers a high degree of resilience.

As another example, an operating method for a safety-related switching device including a magnetic coil by which a load circuit is interrupted or closed, respectively, is provided. The safety-related switching device has a control unit and a first switching device, by which the following method acts are performed.

In a first method act, a first higher-level control signal that is sent from a higher-level control entity to the safety-related switching device is received by the first switching device. In a further method act, a coil control signal that is generated and sent indirectly or directly from the control unit is received by the first switching device. In a further method act, a monitoring signal that is generated by a watchdog is also received by the first switching device. The watchdog is connected to the control unit and monitors the normal functioning thereof. The monitoring signal shows whether a normal state of the control unit is present. In a further method act, the first switching device registers whether at least one of the received signals prescribes a deactivation of the magnetic coil. If at least one of the received signals (e.g., the first higher-level control signal), the monitoring signal, or the coil control signal exhibits a state that requires a deactivation of the magnetic coil, a deactivation instruction is sent from the first switching device to the magnetic coil. During the operating method, the control unit receives a second higher-level control signal in a further method act and initiates the corresponding coil control signal to the first switching device. In this case, the first control signal and the second control signal are generated from an external control signal in a further method act by a receiver unit of the safety-related switching device.

In the operating method, the acts in which the first higher-level control signal, the coil control signal, and the monitoring signal are received by the first switching device may be performed essentially simultaneously. The evaluation of the signals arriving at the first switching device may be performed quickly and reliably on simple hardware. A temporal coordination of the signals is not required, and therefore, the first higher-level control signal, the coil control signal, and the monitoring signal may be adapted to other functions of the first higher-level control signal, the coil control signal, and the monitoring signal with respect to timing. The operating method offers an increase in safety. The increase requires no disadvantageous modification of the signals used. The claimed operating method can therefore be realized by means of a simple upgrade of existing hardware.

The first higher-level control signal is transferred from the receiver unit directly to the first switching device.

In one embodiment of the operating method, in an additional method act, a current flow through the magnetic coil is captured by a measuring device. The capture of the current flow may take place cyclically during operation. If the captured current flow in the magnetic coil differs from a settable reference value, a deactivation instruction is sent from the control unit to the first switching device and/or the second switching device in order thereby to interrupt the power supply of the magnetic coil. As a result of the additional method act described, it is provided that a deactivation instruction is successfully implemented by at least one of the available switching devices in the event of a fault.

The operating method is based on a minimum of signals in this case. The signals are routinely generated in switching devices. As a result of the simplicity of the operating method, the operating method may readily be implemented on hardware having limited computing power. Overall, a high degree of operational safety for a safety-related switching device is achieved with reduced expense in terms of hardware and firmware.

As another example, a computer program product that is suitable for storage and execution on a control unit in a corresponding safety-related switching device is provided. The computer program product is configured to perform at least one of the operating methods cited above in one of the safety-related switching devices described above.

As another example, a switching system configured to open or close a load circuit is provided. The switching system includes a higher-level control entity for this purpose (e.g., a stored program control or a safety switching device) that is configured to output a single-channel or a dual-channel external control signal. The higher-level control entity is connected to two safety-related switching devices for this purpose, such that the switching system has a hardware-fault tolerance of at least one. The at least two safety-related switching devices reciprocally represent the corresponding reserve device in each case. If one of the two safety-related switching devices fails (e.g., as a result of contact sticking), the other safety-related switching device is able to perform a safe deactivation of the load circuit. The principle of a dual-channel structure is thereby realized in the switching system. The safety-related switching devices in the switching system are configured in each case according to one of the above described embodiments of the safety-related switching device. The switching system overall has a Safety Integrity Level of up to SIL3, a Performance Level of up to PLe, and a Safety Category of up to 4. The SIL Claim Limit of the switching system is up to SIL CL3.

DETAILED DESCRIPTION

Figure 1:
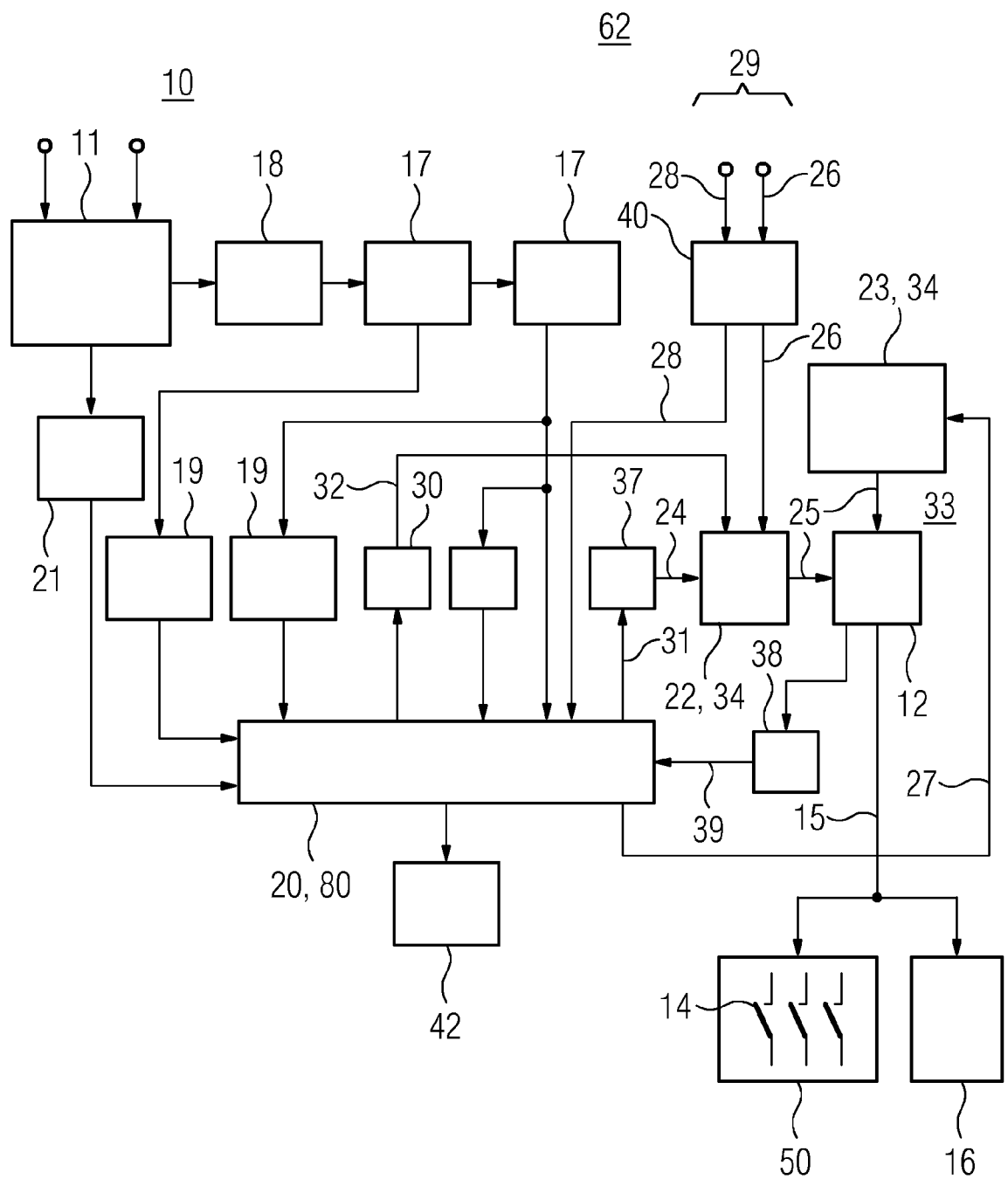
FIG. 1 shows the structure of an embodiment of a safety-related switching device.

FIG. 1 schematically illustrates the structure of an embodiment of a safety-related switching device 10. The safety-related switching device 10 is connected to a load circuit 50. The power supply of the safety-related switching device 10 is effected via a mains supply 11 that provides inter alia current for the operation of the individual components in the safety-related switching device 10. The mains supply 11 is connected to a rectifier 18 and a multistage voltage level adjustment. The adjusted voltage levels are monitored by voltage measuring devices 17, and a measurement result is forwarded to a control unit 20. The mains supply 11 is further coupled to a voltage sensor 21. Measurements of the voltage sensor 21 are used to define the pulse width modulation of the coil control signal 24.

The safety-related switching device 10 has a magnetic coil 12 that is configured to perform an electromagnetic actuation of a mechanical coupling 15 to switching contacts 14, which are shown symbolically. The switching contacts 14 are part of the load circuit 50, in which a significantly higher current is carried than in the switching device 10 itself. The switching contacts 14 in the load circuit 50 interact with auxiliary contacts 16, which are used to report the switching state of the switching contacts 14. The magnetic coil 12 may be activated and deactivated via a first switching device 22, which includes an IGBT 34. The first switching device 22 is connected to a signal generator 37 that may be triggered by the control unit 20. The control unit 20 is configured as a microcontroller and is suitable for outputting a signal 31 that is converted into the coil control signal 24 by the signal generator 37. The coil control signal 24 is a pulse-width modulated signal (PWM signal), by which it is possible to set the retention force generated by the magnetic coil 12. The first switching device 22 is configured to receive the coil control signal 24 and to register therefrom whether activation of the magnetic coil 12 is instructed or not. The first switching device 22 is also configured to receive a first higher-level control signal 26 that reaches the safety-related switching device 10 via a receiver unit 40. The higher-level control signal 26 is generated by a higher-level control entity 62 that is not illustrated in greater detail. The first switching device 22 is configured to receive a monitoring signal 32 sent by a watchdog 30. The watchdog 30 is coupled to the control unit 20. The monitoring signal 32 shows in a binary manner whether correct operation of the control unit 20 is present.

The first switching device 22 checks the incoming coil control signal 24, the first higher-level control signal 26 and the monitoring signal 32 in order to determine whether one of these signals prescribes a deactivation of the magnetic coil 12. The check is effected by a suitable logical association of the signals 24, 26, 32 in this case. If at least one of the signals 24, 26, 32 indicates that a deactivation of the magnetic coil 12 is required, a deactivation instruction 25 is sent from the first switching device 22 to the magnetic coil 12. The control unit 20 is configured to receive a second higher-level control signal 28. The first higher-level control signal 26 and the second higher-level control signal 28 belong to a dual-channel external control signal 29 that is sent by the higher-level control entity 62, which is not shown in greater detail but is connected to the safety-related switching device 10 via the receiver unit 40. Using the receiver unit 40, the first higher-level control signal 26 and the second higher-level control signal 28 from the external control signal 29 are supplied in a suitable format for the safety-related switching device 10. The control unit 20 is able to check the consistency of the present actuation status of the magnetic coil 12 using the external control instruction 29.

The control unit 20 is also connected to a measuring device 38 that sends measured data 39. The measured data 39 includes a variable that shows the operating state of the power supply of the magnetic coil 12. The corresponding variable in the measured data 39 is compared with a settable reference value in the control unit 20. The reference value is set by a data record 42 that includes a configuration data record and/or a parameter record. If the captured variable differs in magnitude by more than a selectable tolerance value from the settable reference value, the control unit 20 identifies an abnormal state in the power supply of the magnetic coil 12. The tolerance value may also be set via the data record 42. If an abnormal state of the power supply of the magnetic coil 12 is identified, the control unit 20 sends a cutoff instruction 27 to a second switching device 23. At the same time, the control unit 20 sends a corresponding cutoff instruction to the first switching device 22 in the form of a corresponding signal 31 to the signal generator 37. The captured variable is, for example, a current strength of the power supply of the magnetic coil 12. The second switching device 23 is arranged in a freewheeling circuit 33 and is suitable for switching the magnetic coil 12 to no-load. The second switching device 23 includes a semiconductor switch 34 for this purpose. The isolation of the power supply of the magnetic coil 12 is effected by a deactivation instruction 25 from the second switching device 23.

Using the measured data 39 of the measuring device 38, the control unit 20 is able to verify the successful implementation of a deactivation instruction 25 that has been output by the first switching device 22. If after a deactivation instruction 25 has been output by the first switching device 22, a variable (e.g., the current strength) that is captured by the measuring device 38 indicates an actuation (e.g., an active state of the magnetic coil 12), the control unit 20 is configured to send a corresponding cutoff instruction 27 to the second switching device 23. In the second switching device 23, the cutoff instruction 27 from the control unit 20 is converted into a corresponding deactivation instruction 25, by which the magnetic coil 12 is switched to no-load. The freewheeling circuit 33 including the second switching device 23 therefore provides a fallback facility in the event that correct deactivation of the magnetic coil 12 cannot be guaranteed via the first switching device 22 alone. The safety-related switching device 10 alone offers a Safety Integrity Level of up to SIL2, a Performance Level of up to PLc, and a Safety Category of up to 2. The SIL Claim Limit of the safety-related switching device 10 has a SIL Claim Limit of up to SIL CL2.

Figure 2:
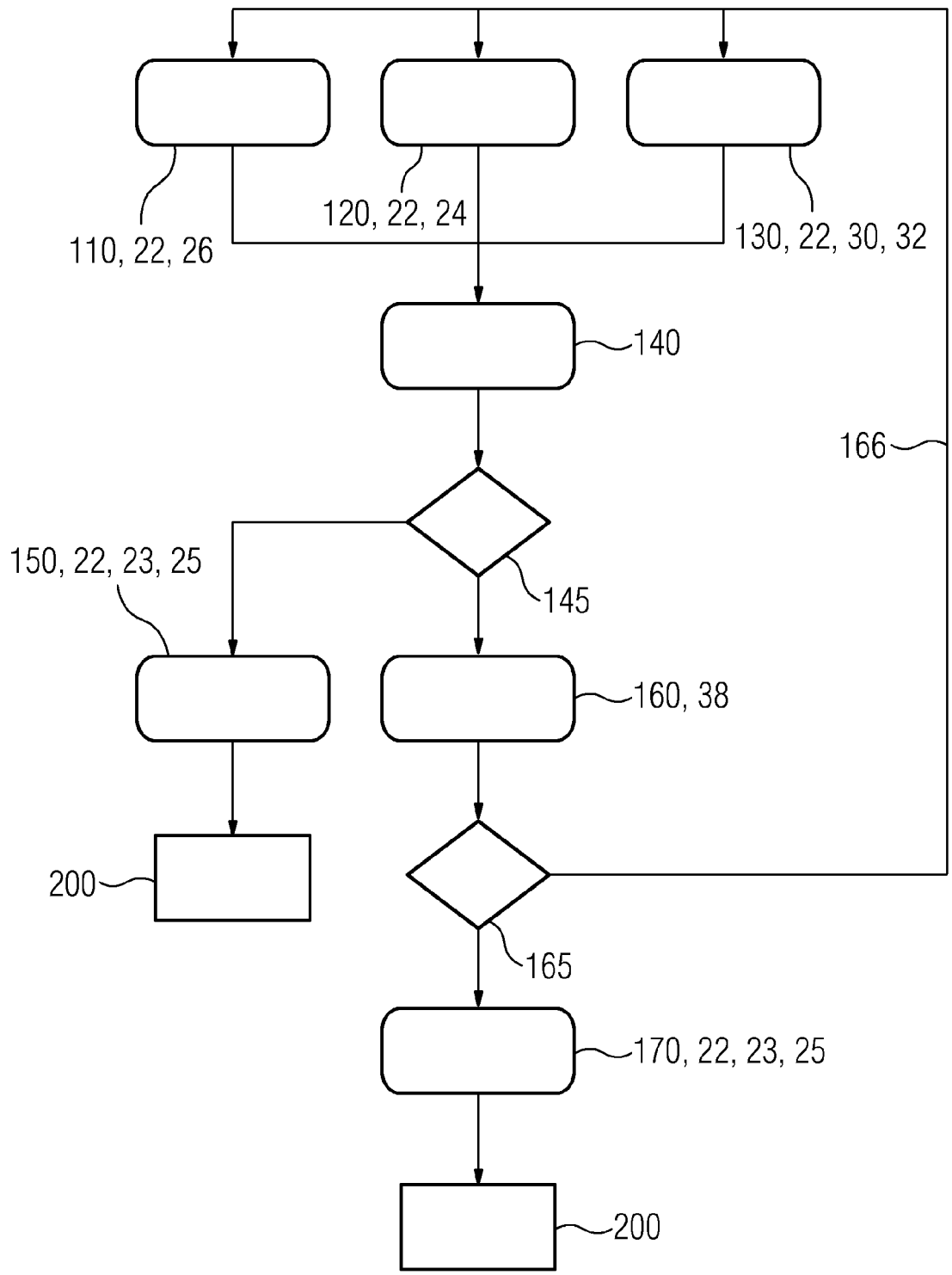
FIG. 2 shows the sequence of an embodiment of an operating method.

FIG. 2 schematically shows the sequence of one embodiment of an operating method 100 for a safety-related switching device 10 that is not illustrated in greater detail. The switching device 10 is configured to open or close a load circuit 50. In a first method act 110, a first higher-level control signal 26 that is sent from a higher-level control entity 62 is received by a switching device 22 in the safety-related switching device 10. In a further method act 120, which takes place essentially in parallel with the first method act 110, a coil control signal 24 that is generated by a control unit 20 of the safety-related switching device 10 is received by the first switching device 22. In a third method act 130, which takes place at essentially the same time as the first act 110 and the second act 120, a monitoring signal 32 is received by the first switching device 22. The monitoring signal 32 represents the report of function monitoring for the control unit 20. For this purpose, the control unit 20 is monitored by a watchdog 30 in order to determine whether the control unit 20 continues to function normally. The monitoring signal 32 shows in a binary manner whether a normal operating state of the control unit 20 is present. In a fourth method act 140 following thereupon, the available signals (e.g., the first higher-level control signal 26), the coil control signal 24 and the monitoring signal 32 are checked in order to determine whether at least one of the coil control signal 24 and the monitoring signal 32 indicates that a deactivation of the magnetic coil 12 is required. This is the case, for example, if isolation of the load circuit 50 is instructed by the first higher-level control signal 26. In addition or alternatively, deactivation of the magnetic coil 12 is required if an instruction from the control unit 20 prescribes an isolation of the load circuit 50 or if the monitoring signal 32 indicates that the control unit 20 is not working normally.

Depending on the result of the fourth method act 140, a first branch 145 of the operating method 100 takes place. If at least one of the signals 24, 26, 32 prescribes a deactivation of the magnetic coil 12, a deactivation instruction 25 is output to the magnetic coil 12 by the first switching device 22 and the second switching device 23 in a fifth method act 150. After the resulting isolation of the load circuit 50, a stable end state 200 is established.

If all signals 24, 26, 32 continue to require an activation of the magnetic coil 12, a sixth method act 160 takes place in which a current flow through the magnetic coil 12 is captured by a measuring device 38. In the sixth method act 160, the captured current flow is compared with a settable reference value. Depending on the result of the comparison between the settable reference value and the captured current flow, a second branch 165 of the method 100 takes place. If an evaluation of the comparison in the act 160 reveals that the safety-related switching device 10 is operating correctly, the method returns 166 to the initial state in the first method act 110.

If the comparison in the sixth method act 160 reveals that the state of the switching device 10 is abnormal, a seventh method act 170 follows. In this act, the control unit 20 causes a deactivation instruction 25 to be output from the first switching device 22 and the second switching device 23 to the magnetic coil 12. An isolation of the load circuit 50 is produced thereby, resulting in a stable end state 200.

Figure 3:
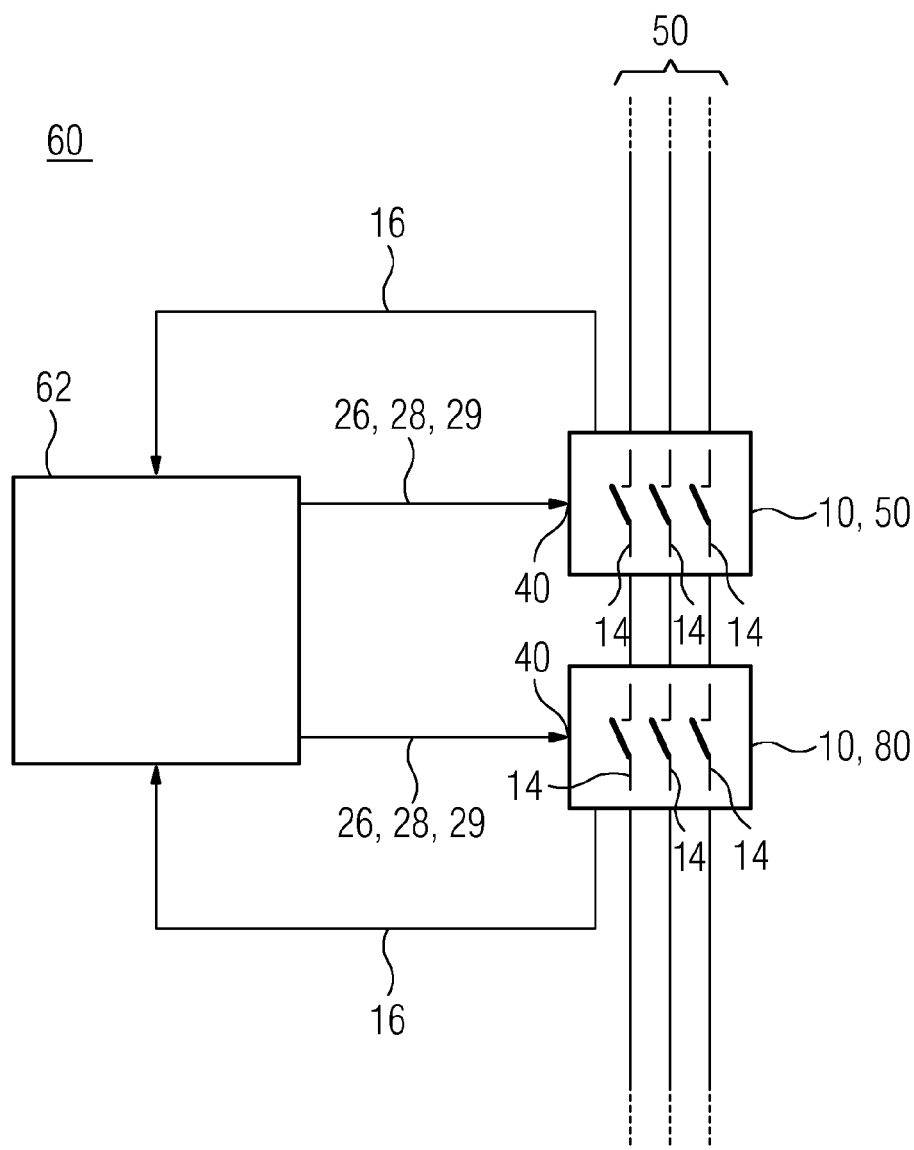
FIG. 3 shows the structure of an embodiment of a switching system.

FIG. 3 illustrates the structure of one embodiment of a switching system 60 having a higher-level control entity 62 that is used to open and close a load circuit 50. The load circuit 50 is shown by way of example as a three-phase power supply. The higher-level control entity 62 has a communication connection to two safety-related switching devices 10. The two safety-related switching devices 10 are configured to interrupt the load circuit 50 independently of each other. A computer program product 80 is stored in each of the safety-related switching devices 10 and is configured in each case to implement the operating method 100 on the safety-related switching devices 10. The safety-related switching devices 10 are triggered separately by the higher-level control entity 62 via external control signals 29. The external control signals 29 include a first higher-level control signal 26 and a second higher-level control signal 28 in each case. The external control signals 29 are received by a receiver unit 40 that supplies the first higher-level control signal 26 and the second higher-level control signal 28 to the safety-related switching devices in a suitable format in each case. In the safety-related switching devices 10, the switching state of the switching contacts 14 that open and close the load circuit 50 is reported back separately in each case by auxiliary contacts 16 to the higher-level control entity 62. By serially combining the two safety-related switching devices 10, a hardware-fault tolerance of one of the two safety-related switching devices 10 is achieved in the switching system 60 of one or more of the present embodiments. The switching system 60 also has a Safety Integrity Level of up to SIL 3 and a Performance Level of up to PLe. The switching system 60 according to FIG. 3 has a Safety Category of 4.

The elements and features recited in the appended claims may be combined in different ways to produce new claims that likewise fall within the scope of the present invention. Thus, whereas the dependent claims appended below depend from only a sing independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A safety-related switching device comprising:
a magnetic coil;
a controller; and
a first switching device configured to:
    activate and deactivate the magnetic coil; and
    receive a coil control signal, a monitoring signal, and a first higher-level control signal,
wherein the safety-related switching device has a receiver unit for receiving an external control signal, the receiver unit being configured to generate the first higher-level control signal and a second higher-level control signal from the external control signal,
wherein for transferring the first higher-level control signal from the receiver unit to the first switching device, the receiver unit and the first switching device are directly connected together,
wherein the controller is configured to receive the second higher-level control signal and to initiate a sending of the coil control signal based on the received second higher-level control signal,
wherein the coil control signal takes the form of a pulse-width modulation signal, the monitoring signal takes the form of an output signal of a watchdog that is connected to the controller, or a combination thereof.

2. The safety-related switching device of claim 1, wherein the safety-related switching device has a second switching device that forms a freewheeling circuit, the freewheeling circuit being connected to the controller and being configured to activate and deactivate the magnetic coil.

3. The safety-related switching device of claim 2, wherein the second switching device comprises a semiconductor switch, at least one logic module, or the semiconductor switch and the at least one logic module.

4. The safety-related switching device of claim 3, wherein the second switching device comprises the semiconductor switch, the semiconductor switch being an IGBT or a MOSFET.

5. The safety-related switching device of claim 1, wherein the first switching device is configured to deactivate the magnetic coil when a coil deactivation is prescribed at least by the first higher-level control signal, the coil control signal, or the monitoring signal.

6. The safety-related switching device of claim 2, wherein the second switching device is configured to deactivate the magnetic coil when a current strength that is present in the freewheeling circuit differs in magnitude by more than a selectable tolerance value from a reference value.

7. The safety-related switching device of claim 1, wherein the first switching device comprises a semiconductor switch, at least one logic module, or the semiconductor switch and the at least one logic module.

8. The safety-related switching device of claim 7, wherein the first switching device comprises the semiconductor switch, the semiconductor switch being an IGBT or a MOSFET.

9. The safety-related switching device of claim 1, wherein a load circuit carrying a power from 50 kW to 750 kW is interruptible by the magnetic coil.

10. An operating method for a safety-related switching device for switching a load circuit by a magnetic coil, wherein the safety-related switching device has a controller and a first switching device, the operating method comprising:
  receiving a first higher-level control signal at the first switching device;
  receiving a coil control signal at the first switching device, wherein sending of the coil control signal is initiated by the controller;
  receiving a monitoring signal at the first switching device, wherein the monitoring signal is sent by a watchdog that monitors the controller;
  sending a deactivation instruction from the first switching device to the magnetic coil when, in the receiving of the first higher-level control signal, the receiving of the coil control signal, the receiving of the monitoring signal, or any combination thereof, a signal that prescribes a deactivation of the magnetic coil is received;
  receiving, by the controller, a second higher-level control signal and initiating the corresponding coil control signal to the first switching device,
  wherein the first higher-level control signal and the second higher-level control signal are generated from an external control signal by a receiver unit, and
  wherein the first higher-level control signal is transferred directly from the receiver unit to the first switching device.

11. The operating method of claim 10, further comprising:
  capturing a current flow through the magnetic coil by a measuring device after expiration of a selectable time duration; and
  sending a deactivation instruction to the first switching device, the second switching device, or the first switching device and the second switching device to interrupt a power supply of the magnetic coil when the current flow captured in the capturing differs from a settable reference value.

12. A switching system for switching a load circuit, the switching system comprising:
  a higher-level control entity configured to output a single-channel or dual-channel external control signal,
  wherein the switching system has a hardware fault tolerance of at least one and is connected to two safety-related switching devices, each of the two safety-related switching devices comprising a magnetic coil, a controller, and a first switching device, the first switching device being configured to activate and deactivate the magnetic coil and receive a coil control signal, a monitoring signal, and a first higher-level control signal, wherein the safety-related switching device has a receiver unit for receiving an external control signal, the receiver unit being configured to generate the first higher-level control signal and a second higher-level control signal from the external control signal, wherein for transferring the first higher-level control signal from the receiver unit to the first switching device, the receiver unit and the first switching device are directly connected together, wherein the controller is configured to receive the second higher-level control signal and to initiate a sending of the coil control signal based on the received second higher-level control signal, and wherein the coil control signal takes the form of a pulse-width modulation signal, the monitoring signal takes the form of an output signal of a watchdog that is connected to the controller, or a combination thereof.

13. In a non-transitory computer-readable storage medium that stores instructions executable by a control unit of a safety-related switching device to operate a safety-related switching device for switching a load circuit by a magnetic coil, wherein the safety-related switching device has a controller and a first switching device, the instructions comprising:
  receiving a first higher-level control signal at the first switching device;
  receiving a coil control signal at the first switching device, wherein sending of the coil control signal is initiated by the controller;
  receiving a monitoring signal at the first switching device, wherein the monitoring signal is sent by a watchdog that monitors the controller;
  sending a deactivation instruction from the first switching device to the magnetic coil when, in the receiving of the first higher-level control signal, the receiving of the coil control signal, the receiving of the monitoring signal, or any combination thereof, a signal that prescribes a deactivation of the magnetic coil is received;
  receiving, by the controller, a second higher-level control signal and initiating the corresponding coil control signal to the first switching device,
  wherein the first higher-level control signal and the second higher-level control signal are generated from an external control signal by a receiver unit, and
  wherein the first higher-level control signal is transferred directly from the receiver unit to the first switching device.

* * * * *